United States Patent [19]
Sahara

[11] Patent Number: 5,841,151
[45] Date of Patent: Nov. 24, 1998

[54] QUASI TYPE II SEMICONDUCTOR QUANTUM WELL DEVICE

[75] Inventor: Richard Sahara, Watertown, Mass.

[73] Assignee: Fujitsu Limited, Kanagawa, Japan

[21] Appl. No.: 544,088

[22] Filed: Oct. 17, 1995

[30] Foreign Application Priority Data

Mar. 20, 1995 [JP] Japan .................................. 7-061013

[51] Int. Cl.$^6$ .................................................. H01L 29/06
[52] U.S. Cl. ............................... 257/14; 257/22; 359/248
[58] Field of Search .................................. 257/9, 14, 18, 257/21, 22, 23, 28; 359/248; 372/26; 385/2, 10

[56] References Cited

U.S. PATENT DOCUMENTS

| | | |
|---|---|---|
| 5,159,421 | 10/1992 | Wolff .......................................... 357/30 |
| 5,194,983 | 3/1993 | Voisin ........................................ 359/245 |
| 5,481,559 | 1/1996 | Kawamura .................................. 372/50 |

*Primary Examiner*—Olik Chaudhuri
*Assistant Examiner*—Douglas A. Wille
*Attorney, Agent, or Firm*—Armstrong, Westerman, Hattori, McLeland & Naughton

[57] ABSTRACT

A semiconductor device having a quantum well structure, the quantum well structure having: a first quantum well layer for forming a quantum well for electrons, the first quantum well layer having a first band structure; a second quantum well layer for forming a quantum well for holes, the second quantum well layer having a second band structure different from the first band structure; and an intermediate layer interposed between the first and second quantum well layers having a third band structure different from the first and second band structures, wherein the first quantum well layer forms a barrier to holes, and the second quantum well layer forms a barrier to electrons. Semiconductor devices having quantum well structures different from conventional type I and II quantum well structures are provided.

7 Claims, 10 Drawing Sheets

QUASI TYPE II SEMICONDUCTOR QUANTUM WELL DEVICE

BACKGROUND OF THE INVENTION a) Field of the Invention

The present invention relates semiconductor devices, particularly semiconductor devices having a quantum well.

b) Description of the Related Art

A quantum well structure can be formed by sandwiching a semiconductor thin layer of a narrow band gap between semiconductor layers of a broad band gap. If a single semiconductor thin layer constitutes a quantum well for both electrons and holes, this quantum well is called a type I quantum well. In this case, the semiconductor layer of a narrow band gap is called a well layer, and the semiconductor layers of a broad band gap are called barrier layers.

A type I multi-quantum well structure can be formed by alternately laminating semiconductor layers of narrow and broad band gaps.

A structure called a type II quantum well structure has a first semiconductor layer forming a quantum well for electrons, a second semiconductor layer forming a quantum well for holes formed on the first semiconductor layer, and third semiconductor layers sandwiching the first and second semiconductor layers for forming barriers to electrons and holes. A type II multi-quantum well structure can be formed by alternately laminating the first semiconductor layer, second semiconductor layer, and third semiconductor layer where necessary.

Also known are a graded band gap quantum well, a coupled quantum well, and a coupled super lattice. The graded band gap well has a pre-bias function by forming a well layer of a type I or II quantum well structure by graded band gap material. The coupled quantum well has a plurality of type I quantum well layers coupled by thin barrier layers allowing carriers to tunnel therethrough. The coupled superlattice is made of coupled quantum wells and has a state (level) or states common to all well layers and a state or states restricted only to each single well layer.

Such quantum well structures and multi-quantum well structures can be applied to various semiconductor devices. For example, semiconductor lasers of the type I multi-quantum well structure utilize the characteristics of the structure that electrons and holes become more stable in the well layer.

In the optical communications field, a light source and a modulator are very important. Although an output light beam of a laser light source can be modulated by turning on and off the laser light source, the stability of an output wavelength becomes poor and so-called charping occurs. In order to maintain a light wavelength stable and modulate a light beam at high speed, it is preferable to continuously drive the laser light source and modulate the light beam by a modulator. A modulator using a quantum well structure is being developed.

Figure 9A:
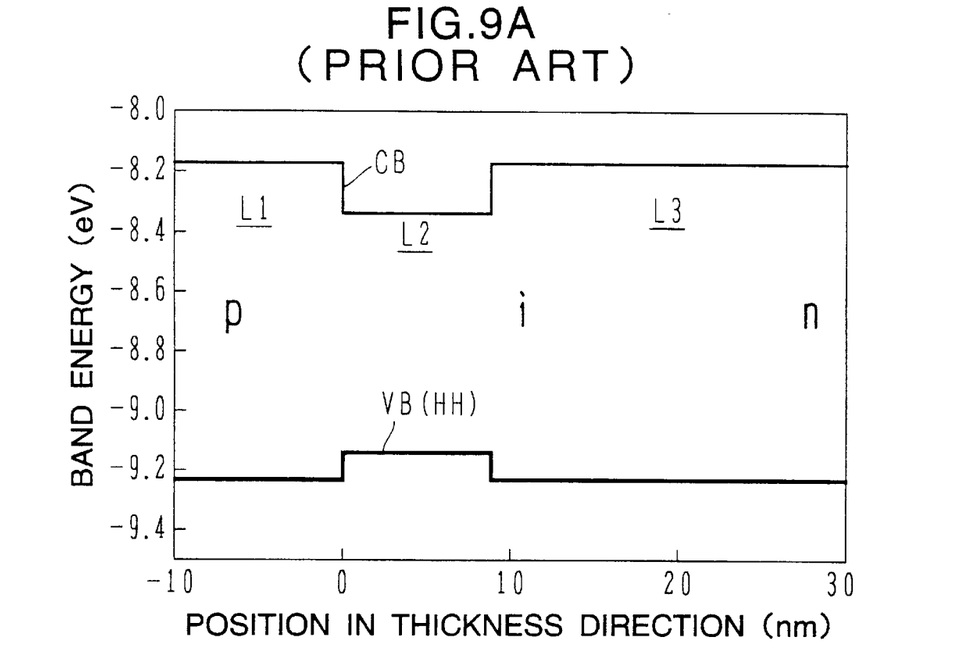
FIGS. 9A and 9B are graphs illustrating a conventional type I quantum well structure.
Figure 9B:
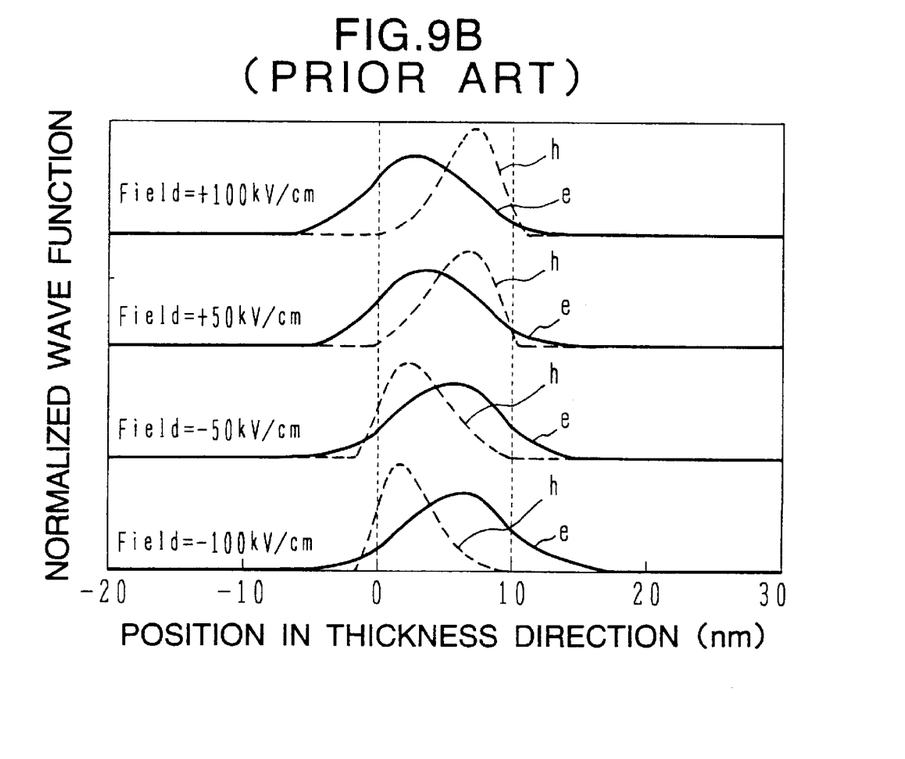

FIGS. 9A and 9B show an example of a type I quantum well structure. FIG. 9A shows a band energy distribution of a type I quantum well as a function of a position in the depth direction. On an InP substrate, a p-type layer, a quantum well structure, and an n-type layer are laminated to form a p-i-n structure. The barrier layers L1 and L3 in the quantum well structure are $In_{0.73}Ga_{0.27}As_{0.49}P_{0.51}$ and have an expansion or tensile strain of −0.31% relative to the InP substrate. The band energy of the conduction band in the barrier layer L1 is −8.173 eV, the band energy of heavy holes in the valence band is −9.228 eV, and the band energy of light holes in the valence band is −9.206 eV.

The well layer L2 is $In_{0.89}Ga_{0.11}As_{0.65}P_{0.35}$ having a compressive strain of +1.32%. The band energy of the conduction band is −8.344 eV, the band energy of heavy holes in the valence band is −9.138 eV, the band energy of light holes in the valence band is −9.221 eV. The thickness of the well layer L2 is, for example, 9.0 nm. The well layer L2 and adjacent barrier layers L1 and L3 are undoped.

Instead of a single well layer, a multi-quantum well layer may be formed by alternately laminating the well layer L2 and barrier layer L1 (L3). This type I quantum well structure has a quantum well for both electrons and holes in a same single layer.

Under the condition that a bias electric field is not applied to such a p-i-n structure, both the wave function of electrons in the conduction band and the wave function of holes in the valence band distribute symmetrically centering on the well layer 2. The peak of the wave function of electrons is located at the same position as the peak of the wave function of holes.

When light having a photon energy larger than the band gap of the well layer L2 is incident to the quantum well structure, pairs of electrons and holes are generated and the incident light is absorbed.

FIG. 9B shows a distribution of the wave functions when a bias electric field is applied to the quantum well structure shown in FIG. 9A. Electrons and holes receive forces by the electric field so that the distribution of the wave functions changes and departs from each other.

FIG. 9B shows distributions of the wave functions in four rows at four different electric field intensities of different polarities. In FIG. 9B, a solid line shows the wave function of electrons, and a broken line shows the wave function of holes (heavy holes). As shown in FIG. 9A, this quantum well structure is symmetrical in the thickness direction. The distribution of the wave function upon application of a positive electric field is symmetrical with that upon application of a negative electric field.

As an electric field is applied along a layer lamination direction, holes move toward the direction of the electric field, whereas electrons move toward the opposite direction of the electric field. Therefore, the wave functions of electrons and holes having the same peak position when an electric field is not applied, move in opposite directions and the overlap of two peaks reduces, as the intensity of the electric field is increased. A reduced overlap of two peaks means a lowered light absorption intensity. A square of the overlap of wave functions represents a light absorption intensity and is proportional to a transition probability, i.e., oscillator strength.

The band structure shown in FIG. 9A is tilted upon application of an electric field. For example, if the band of the well layer L2 is tilted lower right, the distribution of the wave function of electron is shifted right, and that of holes is shifted left. Therefore, the energy necessary for generating pairs of electron and holes lowers by an amount corresponding to a tilt of the band structure, and an absorbed light wavelength shifts to the longer wavelength side (red shift).

Figure 4:
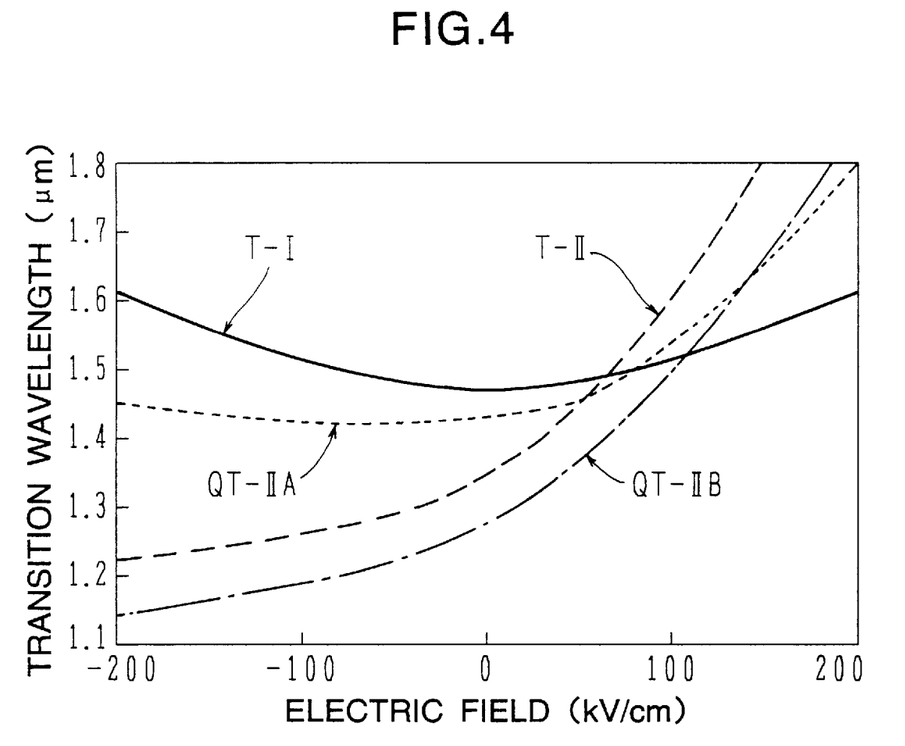
FIG. 4 is a graph showing an applied electric field dependency of transition wavelengths of quasi types IIA and IIB, together with conventional types I and II.
Figure 5:
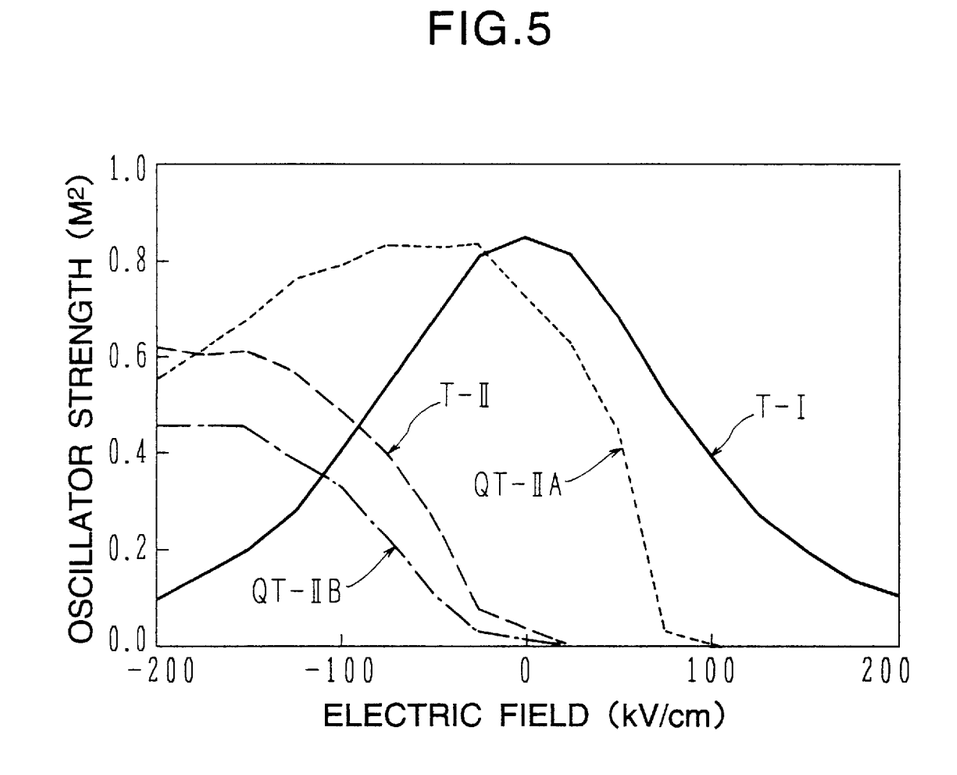
FIG. 5 is a graph showing an oscillator strength of the quantum well structures of quasi types IIA and IIB, together with conventional types I and II, as a function of an applied electric field.

A change in an inter-band transition wavelength and a change in an oscillator strength (transition probability) are shown in FIGS. 4 and 5 by using an applied electric field as a parameter. In FIGS. 4 and 5, T-I shows the characteristics of a type I quantum well structure. Because of the symmetry of the type I quantum well structure, the inter-band transition wavelength shows a red shift symmetrically at the positive and negative electric fields. It is reported that the shift amount is proportional to the fourth power of the thickness of a well layer. The oscillator strength (transition probability) is maximum when an electric field is not applied, and gradually lowers as the intensity of the applied electric field is increased. This corresponds to a reduction of the overlap of the wave functions.

Figure 10A:
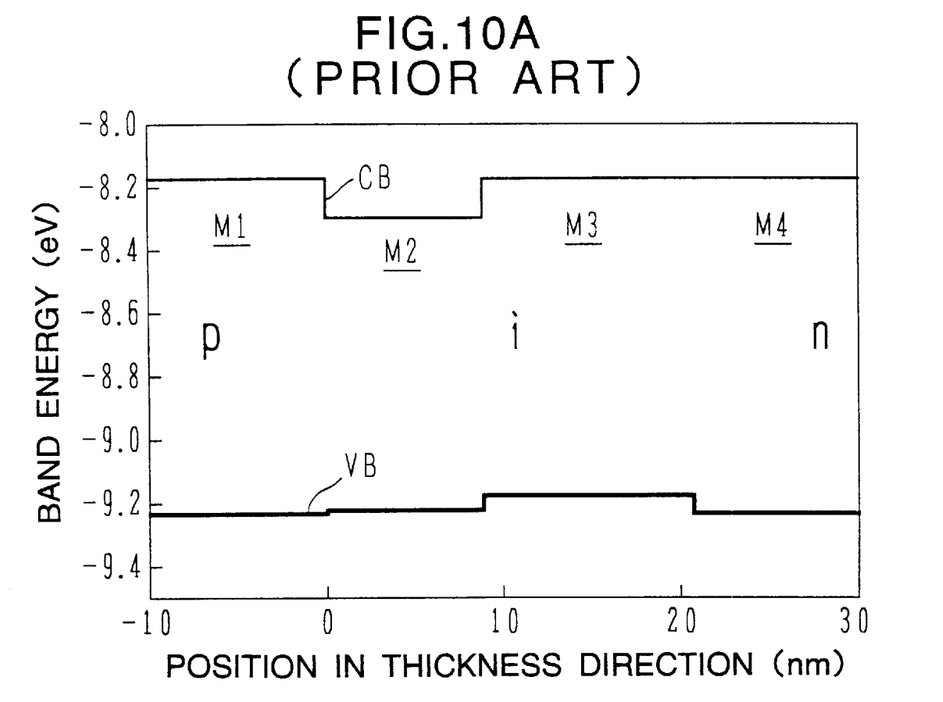
FIGS. 10A and 10B are graphs illustrating a conventional type I quantum well structure.
Figure 10B:
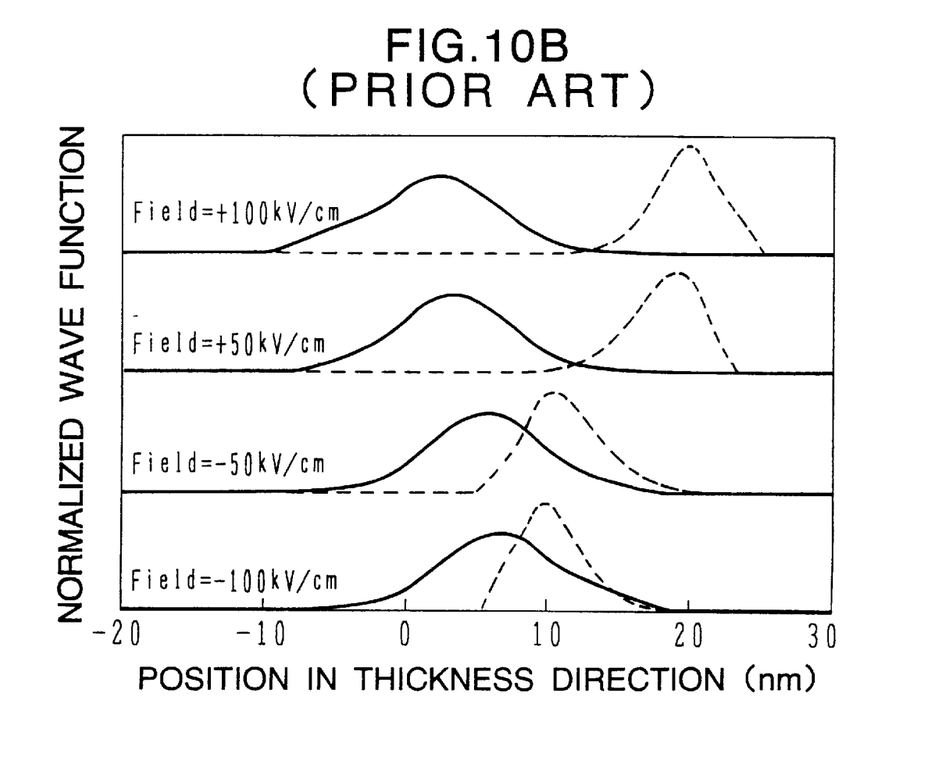

FIGS. 10A and 10B show an example of a type II quantum well structure. FIG. 10A shows a band energy distribution of a type II quantum well as a function of a position in the depth direction. The type II quantum well structure shown in FIG. 10A is a laminate of a barrier layer M1, a well layer M2 for electrons, a well layer M3 for holes, and a barrier layer M4. A p-type layer is formed continuously from the barrier layer M1, and an n-type layer is formed continuously from the barrier layer M4. The well layer M2 for electrons and the well layer M3 for holes are stacked one upon the other, and the barrier layers M1 and M4 are formed on both sides of the stacked layers M2 and M3.

For the multi-quantum well structure, the layers M1 and M4 are formed of the same layer.

For example, this quantum well structure is formed on an InP substrate. The layer M1 (M4) is $In_{0.73}Ga_{0.27}As_{0.49}P_{0.51}$ and has an expansion (tensile) strain of −0.31% relative to the InP substrate. The band energy of the conduction band is −8.173 eV, the band energy of heavy holes in the valence band is −9.228 eV, and the band energy of light holes in the valence band is −9.206 eV.

The well layer M2 for electrons is an $InAs_{0.43}P_{0.57}$ layer having a compressive strain of +1.37 %. This layer M2 has a thickness of, for example, 9.0 nm. The band energy of the conduction band is −8.295 eV, the band energy of heavy holes in the valence band is −9.220 eV, the band energy of light holes in the valence band is −9.307 eV.

The well layer M3 for holes is $In_{0.53}Ga_{0.47}As_{0.71}P_{0.29}$ and has an expansion (tensile) strain of −1.0%. This layer M3 has a thickness of, for example, 12.0 nm. The band energy of the conduction band is −8.169 eV, the band energy of heavy holes in the valence band is −9.178 eV, and the band energy of light holes in the valence band is −9.105 eV.

Similar to FIG. 9B, FIG. 10B shows a shift of the wave functions as an electric field is applied to the quantum well structure shown in FIG. 10A.

In the type II quantum well structure, the wave functions of electrons and holes are separated because the positions of the quantum wells for electrons and holes are different even with no applied electric field. If the thickness of the quantum well layers combined is equal to, or smaller than, the distribution range of a wave function, then the wave function penetrates into the barrier layer and distributes therein.

As shown in FIG. 10B at the upper two rows, as an electric field of a polarity which drives electrons and holes away from each other is applied, the distribution of the wave functions of electrons and holes is separated further. Conversely, if an electric field of a polarity which drives electrons and holes near to each other, the wave functions of electrons and holes shift to the interface between the two quantum well layers, and penetrate into the barrier layer, to increase the overlap of the wave functions.

Since the two well layers contact at the interface, there is an overlap of the wave functions near at the interface even with no applied electric field so that light is absorbed. A change in the oscillator strength relative to the intensity of an electric field is shown by a curve T-II in FIG. 5.

Upon application of an electric field of a polarity tilting the band structure lower left as viewed in FIG. 10A, the distribution of the wave functions of electrons and holes separates. In this case, the transition energy reduces by an amount corresponding to a tilt of the band structure, and the transition wavelength moves to the longer wavelength side (red shift).

As an electric field of a polarity which drives the wave functions near to each other (moving the band structure lower right) is applied, although the band gap at the interface does not change, a triangular potential is generated because the band energy at the bottom of the well layer is slanted, the distribution of the wave functions concentrates near the interface, and the effective well width is narrowed. The transition energy increases slightly. This slight increase of the transition energy makes the transition wavelength shorter (blue shift). A curve T-II of FIG. 4 indicates this change.

A conventional optical modulator with a quantum well structure utilizes the red shift of a transition wavelength with an applied electric field. Incident light has a wavelength slightly longer than that corresponding to a light absorption edge energy with no applied electric field. The light absorption edge wavelength shifts to the longer wavelength side by the red shift with an applied electric field. As a result, the incident light wavelength having belonged to the transparent region changes to belong to the absorption region.

In the type I, an overlap of the wave functions reduces when an electric field is applied, and so the oscillator strength lowers. In the type II, although an overlap of the wave functions increases when an electric field is applied, it is very difficult to make the wave functions overlap completely. It is therefore difficult to make the oscillator strength sufficiently high.

Conventional quantum well structures have some limit in their operation performance. A contrast between a transparent state and an opaque state made by turning on and off an electric field has been limited to a certain value.

For a modulator using a quantum well structure, it is desired that a transparent state is set when an electric field is not applied or an electric field of a first intensity is applied, and an opaque state is set when an electric field of a second intensity is applied. If the opaque state is set when an electric field is applied, electron/hole pairs generated by light absorption are moved swiftly by the established electric field so that a high speed response is possible.

It is more desired that the transparent state without light absorption is set under the condition of no applied electric field. The higher the absorption coefficient in the opaque state with applied electric field, the more preferable. If the absorption coefficient is low, a longer modulator is required for absorbing light sufficiently and light absorption saturation is likely to occur.

SUMMARY OF THE INVENTION

It is an object of the present invention to provide a semiconductor device having a quantum well structure different from the types I and II.

It is another object of the invention to provide a quantum well structure having a low light absorption with no applied electric field.

It is still another object of the present invention to provide a semiconductor device having a quantum well structure with a high light absorption coefficient.

It is a further object of the present invention to provide a semiconductor device having a quantum well structure of a short transition wavelength.

According to one aspect of the present invention, there is provided a semiconductor device having a quantum well structure, the quantum well structure comprising: a first quantum well layer for forming a quantum well for electrons, the first quantum well layer having a first band structure; a second quantum well layer for forming a quantum well for holes, the second quantum well layer having a second band structure different from the first band structure; and an intermediate layer interposed between the first and second quantum well layers having a third band structure different from the first and second band structures, wherein the first quantum well layer forms a potential barrier to holes, and the second quantum well layer forms a potential barrier to electrons.

Similar to a conventional type II quantum well structure, a first quantum well layer for forming a quantum well for electrons and a second quantum well layer for forming a quantum well for holes are used, and in addition, an intermediate layer is interposed between the first and second quantum well layers. A quantum well structure having novel characteristics not found in conventional structures can be realized.

If the band energies of the conduction band and valence band of the intermediate layer are lower than the band energies of the quantum wells of the first and second quantum well layers, the characteristics of the quantum well structure are intermediate between those of conventional type I and II quantum well structures. Low or high band energy means low or high energy of carriers associated with its band. In the band structure diagrams shown in FIGS. 9A and 10A, the band energy becomes higher at the higher level in the conduction band, whereas the band energy becomes higher at the lower level in the valence band.

In the conventional type I quantum well structure, both electrons and holes are present in a single well layer. It is therefore difficult to set the light absorption intensity to 0 even if the intensity of an applied electric field is increased.

In the quantum well structure of this invention having the intermediate layer between two quantum well layers of the type II quantum well structure, as an electric field of a polarity accelerating electrons and holes away from each other is applied, overlap of the wave functions can be reduced and the absorption coefficient in a light transmission state can be lowered. As an electric field of a polarity accelerating electrons and holes near to each other is applied, overlap of the wave functions of electrons and holes can be increased to obtain a higher oscillator strength. In the case when the band energy of the intermediate layer is higher than that of the well layer, the wave functions of electrons and holes can be separated more than the conventional type II quantum well structure. Reduction of an overlap of the wave functions of electrons and holes in a state of no applied electric field allows a transparent state to be set under the condition of no applied electric field.

In the above manner, a semiconductor device having a quantum well structure with novel characteristics can be provided.

A quantum well structure which is almost transparent under one condition and strongly light absorptive under another condition can be provided by inserting an intermediate layer of narrow band gap semiconductor between the electron well layer and hole well layer.

A semiconductor device with a quantum well structure which reduces light absorption in a state of no applied electric field can be provided by inserting an intermediate layer of wide band gap semiconductor between the electron well layer and hole well layer.

DETAILED DESCRIPTION OF THE PREFERRED EMBODIMENTS

The inventor proposes a quantum well structure capable of taking a transparent state and an opaque state depending upon a change in an oscillator strength rather than a shift of transition energy.

Figure 1:
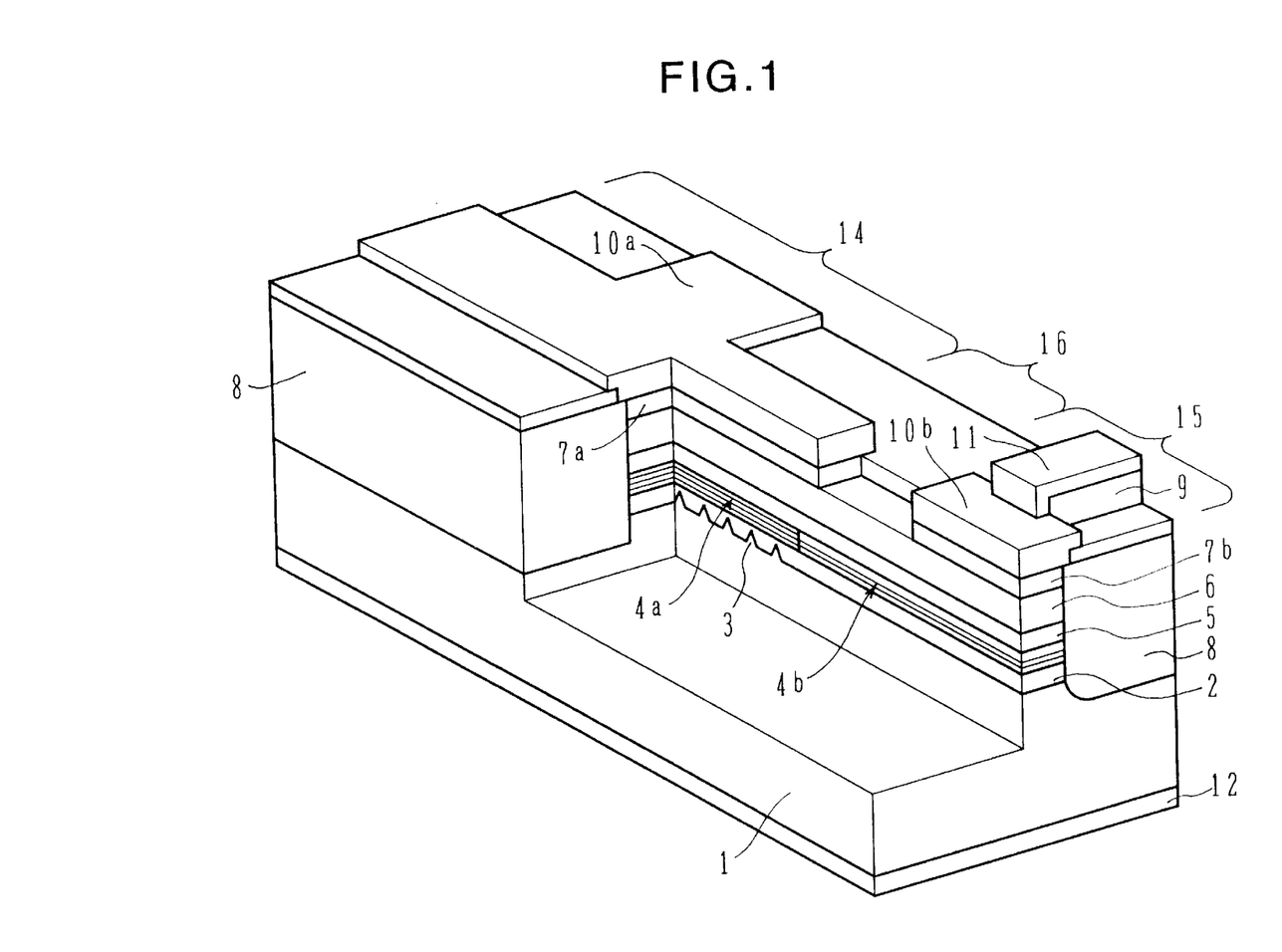
FIG. 1 is a partially broken schematic perspective view showing the structure of a modulator integrated distributed feed-back laser according to an embodiment of the invention.

FIG. 1 is a partially broken perspective view showing the structure of a modulator-integrated distributed feed-back laser according to an embodiment of the invention. On a partial area of the surface of an n-type InP substrate 1, a diffraction grating 3 is formed. On this substrate 1, an n-type layer 2 is grown. Formed on this layer 2 are a distributed feeding-back (DFB) type laser 14 and a modulator 15 between which a separation region 16 is inserted.

The DFB laser 14 is a laminate of an n-type clad layer 2, a lasing active layer 4a, a p-type clad layer 5, a p-type layer 6, and a p-type contact layer 7a, stacked on the diffraction grating 3 in this order. The modulator 15 is a laminate of a multi-quantum well modulating active layer (light absorbing layer) 4b on the n-type layer 2, p-type layers 5 and 6 and p-type contact layer 7b on the layer 4b.

The separation region 16 is realized by removing the intermediate regions of the contact layers 7a and 7b from the laminate structure.

A mesa structure with a width of about 1 to 3 µm is formed down to the substrate by etching, along the alignment direction of the DFB laser 14 and modulator 15. Both sides of the mesa structure are embedded with semiinsulating embedding hetero regions 8. A p-side electrode 10a is formed on the contact layer 7a of the DFB laser 14, and a p-side electrode 10b is formed on the contact layer 7b of the modulator 15.

A polyimide region 9 is formed near the p-side electrode 10b. A wiring layer 11 formed on the polyimide region is connected to the p-side electrode 10b. An n-side electrode 12 is formed on the bottom of the substrate 1.

This structure can be fabricated by using selective epitaxial growth over the substrate, selective etching, mesa embedding, polyimide coating, substrate polishing, electrode layer deposition, patterning, cleavage, and other techniques. Each process is well-known, and the description thereof is omitted.

With this structure, the DFB laser 14 continuously oscillates to generate light of a single wavelength. The modulator 15 selectively absorbs light emitted from the DFB laser 14 to generate a modulated light output. The multi-quantum well structure 4b of this modulator is realized in the following manner.

Figure 2A:
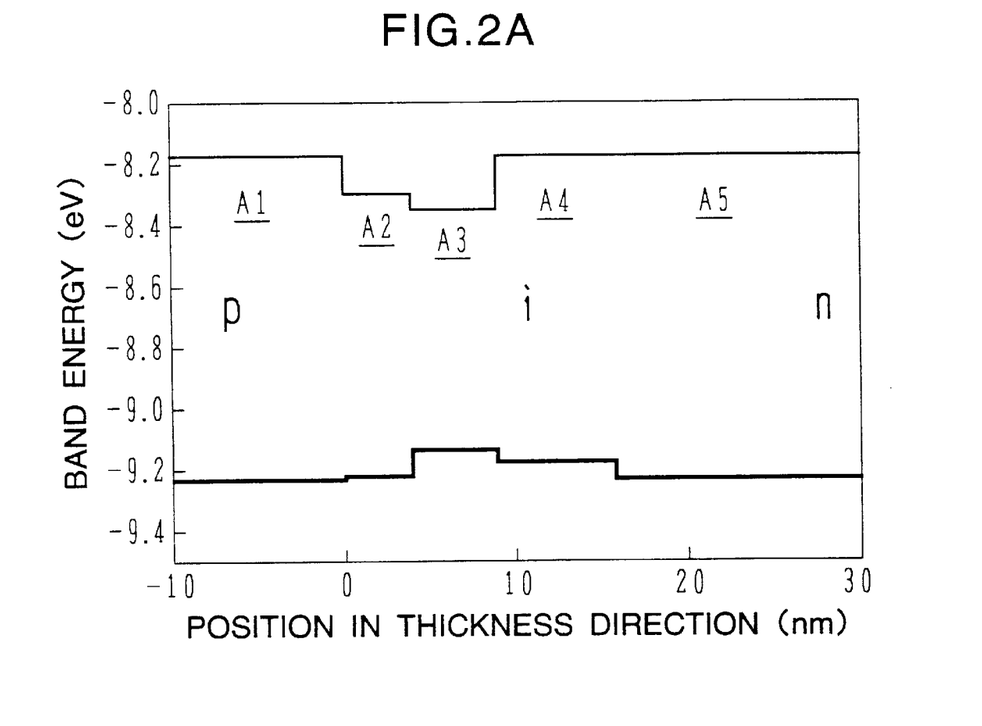
FIGS. 2A and 2B are graphs illustrating a quasi type IIA quantum well structure according to an embodiment of the invention.
Figure 2B:
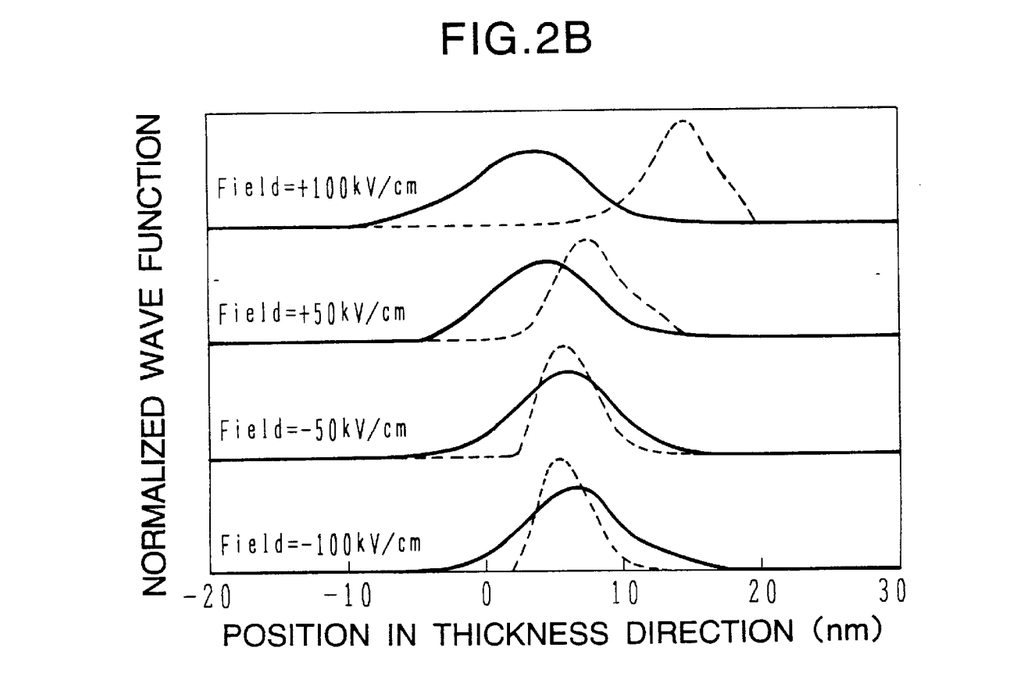

FIGS. 2A and 2B illustrate the outline of a quasi type IIA quantum well structure which is a basic unit for forming a multi-quantum well modulating active layer structure. FIG. 2A shows the band energy as a function of a position in the thickness direction. FIG. 2B shows distributions of normalized wave functions as a function of a position in the thickness direction and by using an applied electric field as a parameter.

In FIG. 2A, a barrier layer A1 forms a potential barrier to electrons and holes. For example, the barrier layer A1 is $In_{0.73}Ga_{0.27}As_{0.49}P_{0.51}$ and has an expansion (tensile) strain of −0.31% relative to the InP substrate. The band energy of the conduction band of the barrier layer is −8.173 eV, the band energy of heavy holes in the valence band is −9.228 eV, and the band energy of light holes in the valence band is −9.206 eV.

A well layer A2 for forming a quantum well for electrons is formed on the barrier layer A1 on the right side thereof as viewed in FIG. 2A. The interface between the barrier layer A1 and well layer A2 is used as a reference position in the depth direction. For example, the well layer A2 for electrons is about 4.0 nm thick and is formed of $InAs_{0.43}P_{0.57}$ having a compressive strain of +1.37% relative to the InP substrate. The band energy of the conduction band of the well layer A2 is −8.295 eV, the band energy of heavy holes in the valence band is −9.220 eV, the band energy of light holes in the valence band is −9.307 eV.

An intermediate well layer A3 is formed on the well layer A2 on the right side thereof. The intermediate well layer A3 forms a deeper well for electrons than the electron well layer A2 and a deeper well for holes than a hole well layer A4. For example, the intermediate well layer A3 is about 5.0 nm thick and $In_{0.89}Ga_{0.11}As_{0.65}P_{0.35}$ having a compressive strain of +1.32% relative to the InP substrate. The band energy of the conduction band of this intermediate well layer A3 is −8.344 eV, the band energy of heavy holes in the valence band is −9.138 eV, and the band energy of light holes in the valence band is −9.221 eV.

A hole well layer A4 for forming a quantum well for holes is formed on the intermediate well layer A3 on the right side thereof. For example, the hole well layer A4 is about 7.0 nm thick and $In_{0.53}Ga_{0.47}As_{0.71}P_{0.29}$ having an expansion (tensile)strain of −1.0% relative to the InP substrate. The band energy of the conduction band of the hole well layer A4 is −8.169 eV, the band energy of heavy holes in the valence band is −9.178 eV, and the band energy of light holes in the valence band is −9.105 eV. A barrier layer A5 made of the same material as the barrier layer A1 is formed on the hole well layer A4 on the right side thereof. In a multi-quantum well structure, the laminate from the barrier layer A1 to the barrier layer A4 may be disposed a plurality of times, and then the barrier layer A5 may be formed. In the case of repetitive disposal, first a barrier layer A1 is formed, then the laminate of layers from A2 to A4 may be disposed a plurality of times without forming the barrier layer, and the barrier layer A5 may be disposed on the laminate structure. The laminate structure is interposed between the p-type layer and n-type layer.

As seen from FIG. 2A, if the intermediate well layer A3 is removed from the structure, the resulting structure is the same as a conventional type II quantum well structure. The intermediate well layer A3 forms a well for electrons deeper than the electron well layer A2 and a well for holes deeper than the hole well layer A4.

By inserting such a narrow band gap semiconductor layer, characteristics similar to a conventional type I quantum well structure can be realized. Namely, the quasi type IIA has the characteristics intermediate between the conventional types I and II quantum well structures. By controlling the parameters of the intermediate well layer A3 such as a well depth and a well width, characteristics covering the range from the type I quantum well structure to the type II quantum well structure can be realized.

Figure 3A:
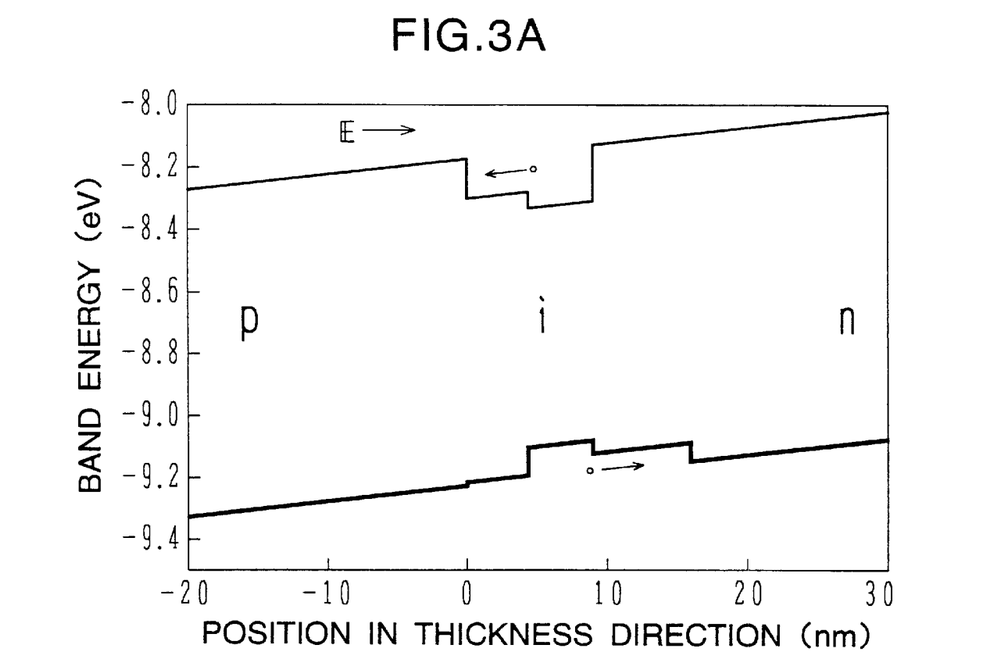
FIGS. 3A and 3B are graphs showing the band structures of the quasi IIA quantum well structure shown in FIGS. 2A and 2B with an applied electric field.
Figure 3B:
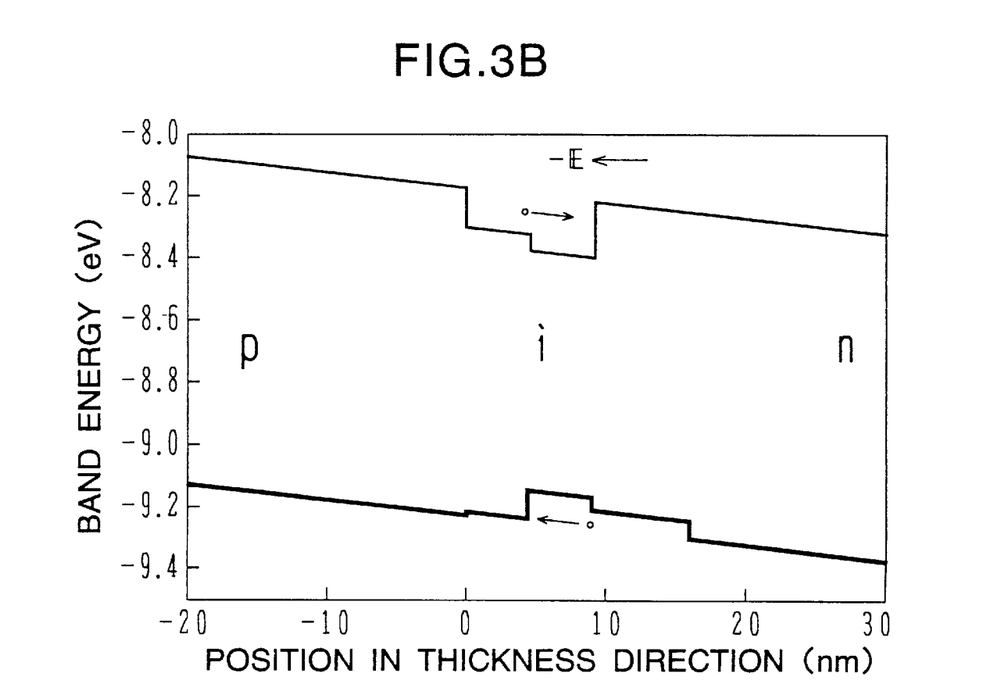

FIGS. 3A and 3B are graphs showing the outline of the band structures when an electric field of a positive or negative polarity is applied to the quasi type IIA quantum well structure. FIG. 3A shows the band structure when a positive forward voltage is applied to the p-type region side. The band structure tilts lower left, and the wave functions of electrons and holes move in the direction of separating them away from each other.

FIG. 3B shows the band structure when an electric field of an opposite polarity is applied to the quasi type IIA quantum well structure. The band structure tilts lower right, both the wave functions of electrons and holes move toward the intermediate well layer.

FIG. 2B is a graph showing the distribution of the wave functions of electrons and holes when an electric field is applied to the quantum well structure shown in FIG. 2A. The distributions of the wave functions of electrons and holes are shown in FIG. 2B at four rows, with different electric fields being applied.

In a state of no applied electric field shown in FIG. 2A, electrons distribute mainly in the electron well layer A2 and intermediate well layer A3. Holes distribute mainly in the intermediate layer A3 and hole well layer A4. As an electric field of a polarity of accelerating the wave functions of electrons and holes near to each other is applied, an overlap of the wave functions of electrons and holes increases.

Conversely, as an electric field of a polarity of accelerating the wave functions of electrons and holes away from each other is applied, an overlap of the wave functions of electrons and holes reduces. In a conventional type I quantum well structure, a single layer forms wells for electrons and holes. Therefore, it is difficult to make an overlap of the wave functions for electrons and holes as small as negligible even if an electric field of a polarity of accelerating the wave functions away from each other is applied.

With the structure of the embodiment, as seen from the wave functions shown in FIG. 2B at the uppermost row, an overlap of the wave functions can be reduced to the negligible degree by applying an electric field having an intensity larger than a certain value and a polarity of moving electrons and holes away from each other.

If an electric field of a polarity of moving electrons and holes near to each other is applied, the peak of the electron wave function can be made coincident with that of the hole wave function, as seen at the third row of the graph shown in FIG. 2B. As an electric field having a further stronger intensity is applied, the wave functions cross and separate in the opposite directions, as seen at the lowest row.

The inventor has given a name "quasi type IIA" to such a quantum well structure. The characteristics of the quasi type IIA quantum well structure are shown by curves QT-IIA in FIGS. 4 and 5.

In FIG. 4, the curve QT-IIA shows the dependency of the transition wavelength of the quasi type IIA quantum well structure upon an applied electric field. When an electric field of the negative polarity is applied as shown in FIG. 3B, the wave functions are blocked by the barrier layers and concentrate to the intermediate well layer. Therefore, the transition wavelength changes scarcely. However, a blue shift can be observed which is considered resulting from an effective reduction of a well width.

When an electric field of the positive polarity is applied as shown in FIG. 3A, electrons and holes move in the opposite directions, and the transition wavelength is made longer (red shift) by an amount corresponding to a tilt of the band structure. The state where the wave functions of electrons and holes are separated is generally equivalent to the type II, and the characteristics are also analogous to the type II characteristics. As seen from FIG. 4 the characteristics are as a whole intermediate between the type I characteristics T-I and the type II characteristics T-II.

In FIG. 5, the curve QT-IIA shows the dependency of the oscillator strength of the quasi type IIA upon an applied electric field. Upon application of a positive polarity electric field, the oscillator strength abruptly lowers. The oscillator strength (absorption coefficient) lowers to almost 0 at an electric field intensity of 100 kV/cm. In contrast, upon application of a negative polarity electric field, the oscillator strength (absorption coefficient) increases a little. The oscillator strength (absorption coefficient) is high at an electric field intensity of about −50 kV/cm, which is generally the same as the type I characteristics T-I.

The quasi type IIA quantum well structure can realize a practically transparent state which is difficult to realize by the type I absorption characteristics, and can realize a high absorption coefficient like the type I characteristics T-I. Here, the term "practically" means a level which can be used in practical usages.

An example of the quasi type IIA quantum well structure has been described above. It can be understood that the following advantageous effects can be obtained by the quasi type IIA quantum well structure.

By adjusting the parameters of the intermediate well layer A3 and other layers, an overlap of the wave functions of electrons and holes can be enhanced. As a result, the oscillator strength at the minimum transition energy can be optimized. As the oscillator strength is increased, the modulator can be shortened so that the capacitance is reduced and a high speed operation can be promoted.

By properly selecting the parameters of the electron and hole well layers while taking the parameters of the intermediate well layer into consideration, the electron and hole wave functions can be controlled almost independently.

By setting the absorption state with no applied electric field and by imparting forces by the electric field to carriers generated upon light absorption, the carrier escape time can be reduced so that a high speed quick response can be realized and the saturation absorption level can be set to a high value.

A dipole moment can be controlled by controlling the separation of the electron and hole wave functions. High $X^2$ nonlinear characteristics can be realized with no bias electric field.

The width of the potential barrier to electrons and holes can be controlled almost independently. It is therefore effective for optimizing the escape time of carriers generated during light absorption.

Using a change in the oscillator strength more than a change in the band energy of the absorption band leaves a possibility of using incident light shorter than the shortest transition wavelength in the transparent state.

There is a possibility that the α parameter of the refractive Index divided by a change in the absorption coefficient can be controlled more effectively than a conventional quantum well structure.

Figure 6A:
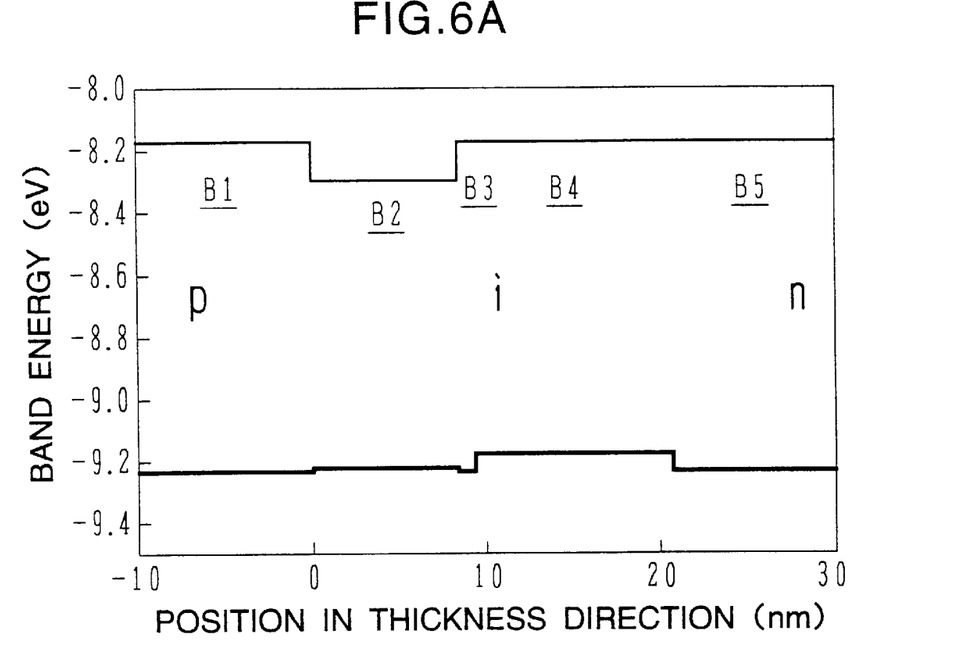
FIGS. 6A and 6B are graphs illustrating a quasi type IIB quantum well structure.
Figure 6B:
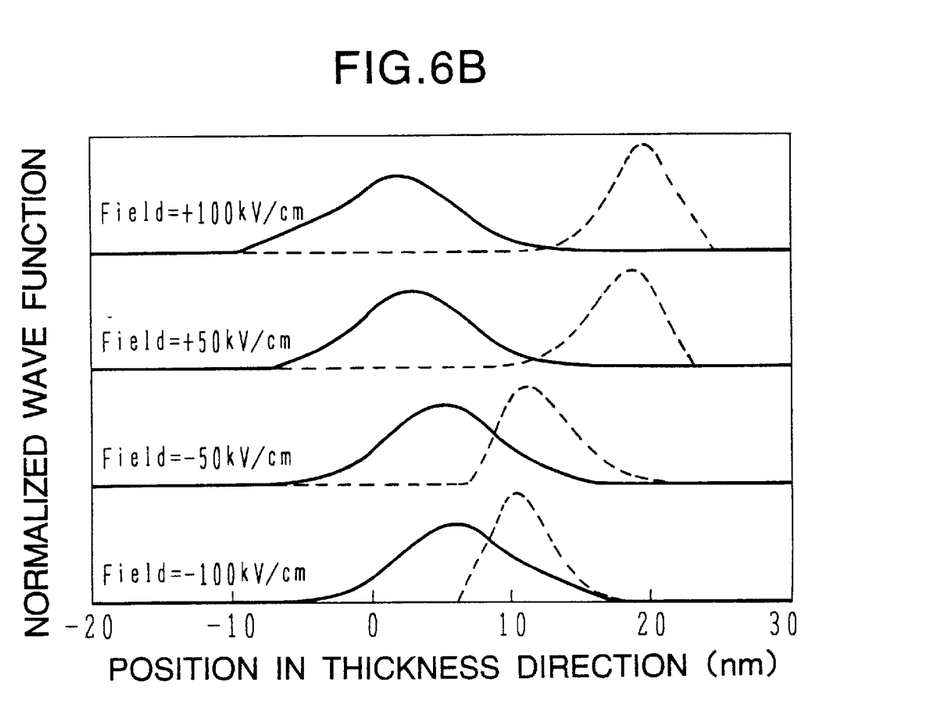

FIGS. 6A and 6B illustrate a quasi type IIB quantum well structure according to another embodiment of the invention. FIG. 6A shows the band energy as a function of a position in the thickness direction. FIG. 6B shows the distributions of normalized wave functions as a function of a position in the thickness direction and by using an applied electric field as a parameter.

In FIG. 6A, a barrier layer B1 forms a potential barrier to electrons and holes. For example, the barrier layer B1 is $In_{0.73}Ga_{0.27}As_{0.49}P_{0.51}$ and has an expansion (tensile) strain of −0.31% relative to the InP substrate. In the band structure of the barrier layer B1, the band energy of the conduction band is −8.173 eV, the band energy of heavy holes in the valence band is −9.228 eV, and the band energy of light holes in the valence band is −9.206 eV.

An electron well layer B2 for forming a quantum well for electrons is formed on the barrier layer B1 on the right side thereof as viewed in FIG. 6A. For example, the electron well layer B2 is about 8.0 nm thick and $InAs_{0.43}P_{0.57}$ having a compressive strain of +1.37% relative to the InP substrate. The band energy of the conduction band of the electron well layer B2 is −8.295 eV, the band energy of heavy holes in the valence band is −9.220 eV, the band energy of light holes in the valence band is −9.307 eV.

An intermediate barrier layer B3 for forming a potential barrier to electrons and holes is formed on the electron well layer B2 on the right side thereof. For example, the intermediate barrier layer B3 is about 1.0 nm thick and $In_{0.73}Ga_{0.27}As_{0.49}P_{0.51}$ having an expansion (tensile) strain of −0.31% relative to the InP substrate. In the band structure of the intermediate barrier layer B3, the band energy of the conduction band is −8.173 eV, the band energy of heavy holes in the valence band is −9.228 eV, and the band energy of light holes in the valence band is −9.206 eV.

A hole well layer B4 for forming a quantum well for holes is formed on the intermediate barrier layer B3 on the right side thereof. For example, the hole well layer B4 is about 11.0 nm thick and $In_{0.53}Ga_{0.47}As_{0.71}P_{0.29}$ having an expansion (tensile) strain of −1.0% relative to the InP substrate. In the band structure of the hole well layer B4, the band energy of the conduction band is −8.169 eV, the band energy of heavy holes in the valence band is −9.178 eV, and the band energy of light holes in the valence band is −9.105 eV. A barrier layer B5 made of the same material as the barrier layer B1 is formed on the hole well layer B4 on the right side thereof.

For a multi-quantum well structure, the layers B1 and B5 are formed of the same layer. After the laminate from the barrier layer B1 to the barrier layer B4 is disposed a plurality of times, the barrier layer B5 is formed last. The barrier to electrons is formed by the consecutive layers B3-B5-B1 (B5), and the barrier to holes is formed by the consecutive layers B1-B2-B3. In the case of repetitive disposal of quantum well structures, first a barrier layer B1 may be formed, then the laminate of layers from B2 to B4 may be disposed a plurality of times without forming the inter-unit barrier layer, and the barrier layer B5 may be disposed on the laminate structure. As shown in FIG. 6A, a p-type region indicated by p in FIG. 6A is formed on the left side of the quantum well structure, and an n-type region indicated by n is formed on the right side of the quantum well structure. The quantum well structure is undoped.

As seen from FIG. 6A, when the intermediate barrier layer B3 is removed from the structure, the resulting structure is the same as a conventional type II quantum well structure. The intermediate barrier layer B3 for forming a barrier to electrons and holes is interposed between the electron well layer B2 and hole well layer B4. Therefore, the electron and hole wave functions separate more than the type II.

The intermediate barrier layer B3 may be a layer which forms a substantial potential barrier to electrons in the electron well layer B2 and to holes in the hole well layer B4. The substantial potential barrier is a potential barrier by which carriers with no applied electric field will not pass through easily by thermal energy.

By controlling the parameters of the intermediate barrier layer B3 such as a barrier height and a barrier width, an overlap of the electron and hole wave functions with no applied electric field can be controlled. The overlap of the wave functions can be made as small as negligible. The parameters of the intermediate barrier layer B3 are properly selected so that an overlap of the electron and hole wave functions can be enhanced. For example, it is preferable that the conduction band of the intermediate barrier layer B3 is given a band offset of about 90 to 140 meV above the conduction band bottom in the electron hole layer B2 and that the valence band of the intermediate barrier layer B3 is given a band offset of about 30 to 60 meV below the valence band top in the hole well layer B4. It is also preferable that the intermediate barrier layer B3 is about 1 to 2 nm thick.

FIG. 6B is a graph showing the distributions of the wave functions of electrons and holes when positive and negative polarity electric fields are applied to the quantum well structure shown in FIG. 6A. The electron and hole wave functions separate further upon application of an electric field of a polarity moving electrons and holes away from each other, and the overlap thereof almost disappears. Upon application of an electric field of a polarity moving electrons and holes near to each other, an overlap of the electron and hole wave functions increases.

The inventor has given a name "quasi type IIB" to such a quantum well structure. With the quasi type IIB quantum well structure, the electron and hole wave functions separate more than the conventional type II quantum well structure.

The characteristics of the quasi type IIB quantum well structure are shown by curves QT-IIB of FIGS. 4 and 5. Although as a whole the transition wavelength characteristics QT-IIB shown in FIG. 4 are similar to the conventional type II characteristics T-II, the transition wavelength becomes short (blue shift).

As seen from the quasi type IIB characteristics QT-IIB of the oscillator strength shown in FIG. 5, the oscillator strength or absorption coefficient reduces more than the conventional type II. The absorption is negligible under the condition of no applied electric field state. In other words, transparency can be increased under the condition of no applied electric field.

With these characteristics, a single polarity voltage can be applied to the modulator and the modulator with no applied electric field can be made practically transparent. Although the oscillator strength is low in the opaque state, an on/off contrast can be made high because the oscillator strength in the transparent state can be set high. With a reduced change in a refractive index and a large ratio of the oscillator strength between on/off transitions, it is possible to realize a modulator with less charping which is suitable for long distance optical communications.

An example of the quasi type IIB quantum well structure has been described above. It can be understood that the following advantageous effects can be obtained by the quasi type IIB quantum well structure.

By adjusting the parameters of the intermediate barrier layer B3 and other layers, an overlap of the wave functions of electrons and holes can be reduced. Therefore, an on/off contrast of the modulator can be improved. The oscillator strength at the minimum transition energy can be optimized.

By properly selecting the parameters of the electron and hole well layers while taking the parameters of the intermediate barrier layer into consideration, the electron and hole wave functions can be controlled almost independently.

By setting the absorption state with applied electric field, the carrier escape time can be reduced so that a high speed quick response can be realized.

A dipole moment can be controlled by controlling the separation of the electron and hole wave functions. High $X^2$ nonlinear characteristics can be realized with no bias electric field.

The width of the potential barrier to electrons and holes can be controlled almost independently. It is therefore effective for optimizing the escape time of carriers generated during light absorption.

Using a change in the oscillator strength, rather than a change in the band energy of the absorption band, leaves a possibility of using incident light shorter than the shortest transition wavelength in the transparent state.

There is a possibility that the $\alpha$ parameter of the refractive index divided by a change in the absorption coefficient can be controlled more effectively than a conventional quantum well structure.

In the above, mainly the quantum well structure of a single cycle or unit has been described. A multi-quantum well structure of the quasi type IIA or IIB can be realized by stacking a plurality of single unit structures.

Figure 7:
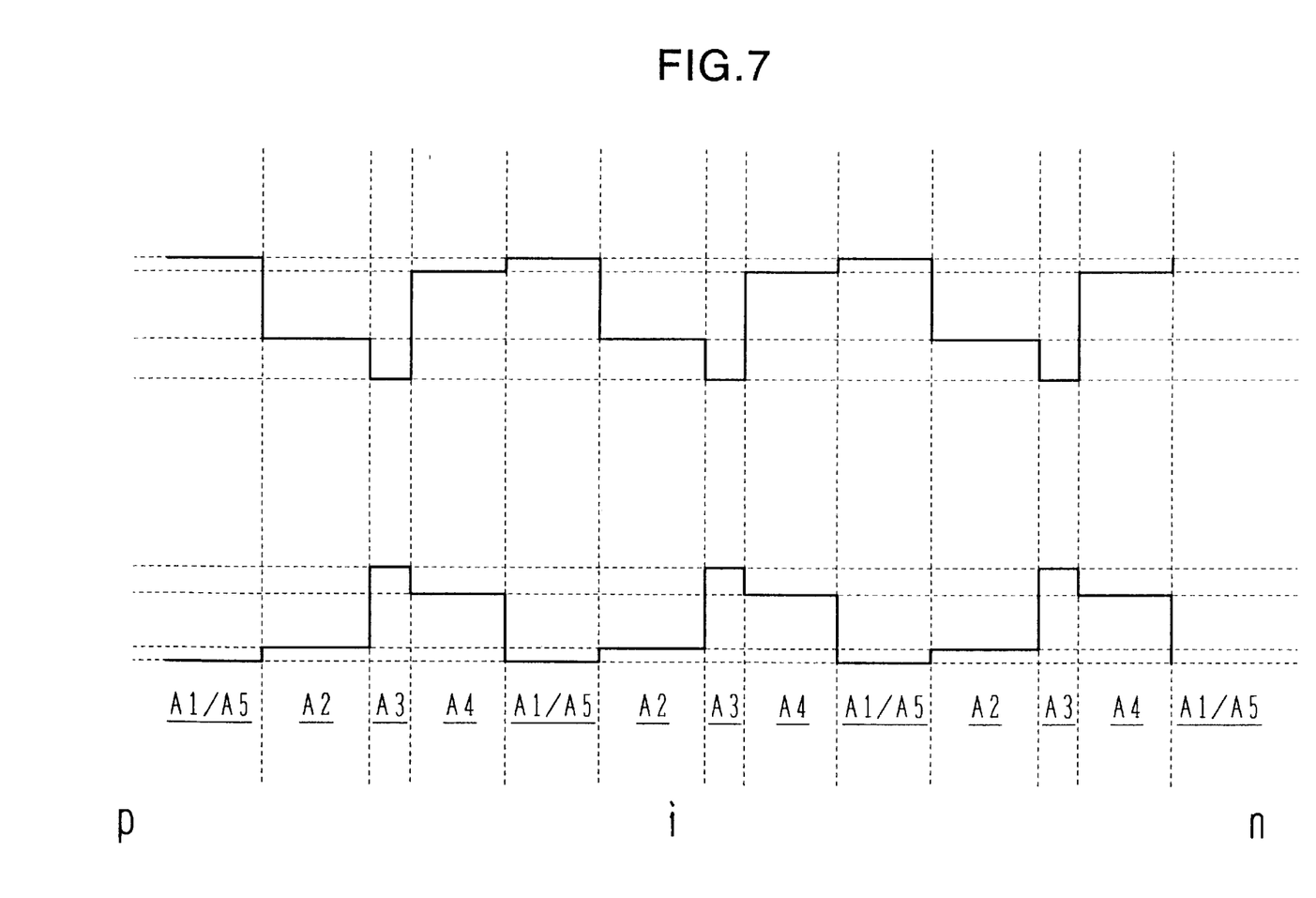
FIG. 7 is a graph illustrating a quasi type IIA quantum well structure.
Figure 8:
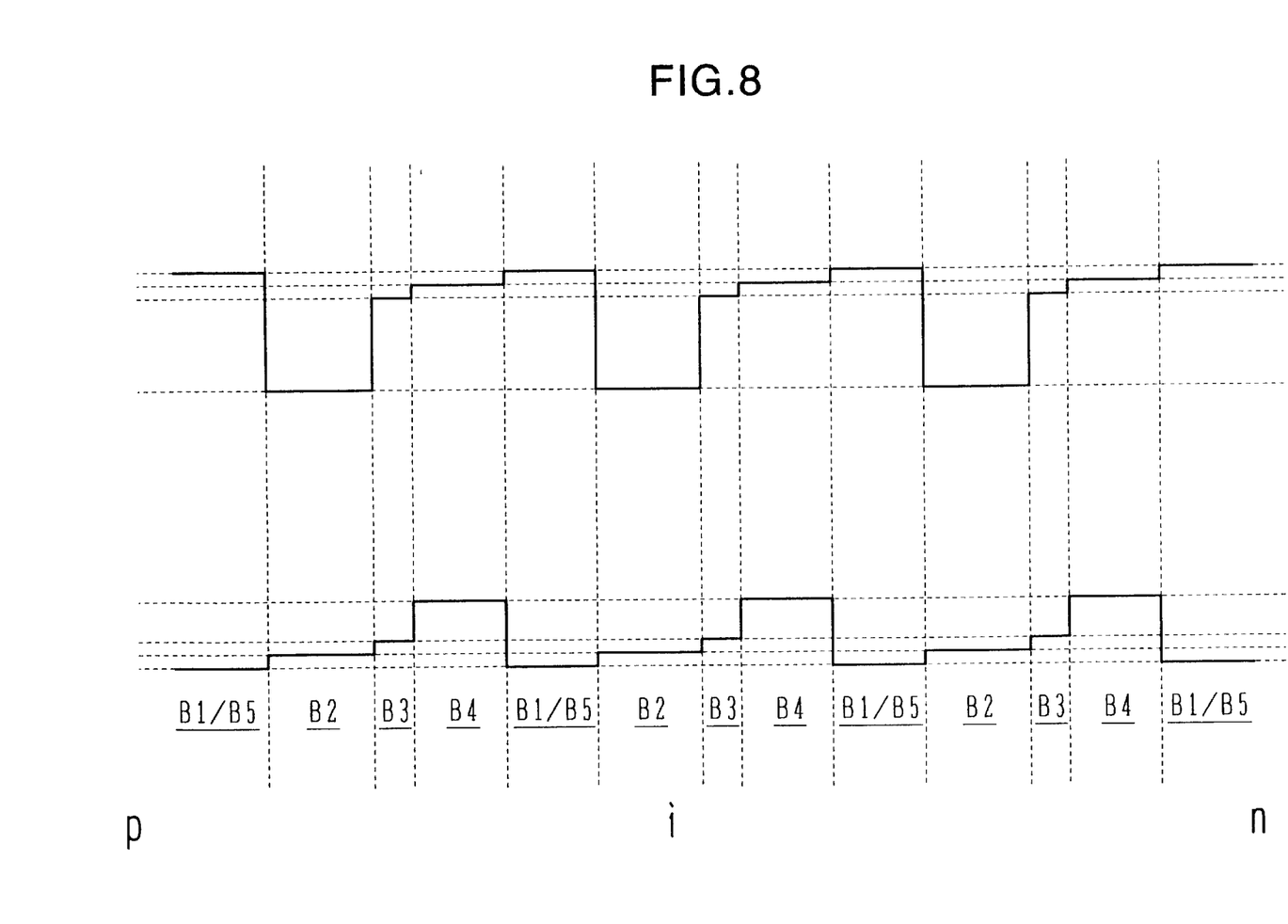
FIG. 8 is a graph illustrating a quasi type IIB multi-quantum well structure.

FIG. 7 shows a quasi type IIA multi-quantum well structure. Layers A1 to A5 correspond to the layers A1 to A5 shown in FIG. 2A. A1/A5 means that the layer A1 functions also as the layer A5. FIG. 8 shows a quasi type IIB multi-quantum well structure made of repetitively disposed quasi type IIB quantum well structures. Layers B1 to B5 correspond to the layers B1 to B5 shown in FIG. 6A. In using the multi-quantum well structure for the modulator, it is preferable to form the multi-quantum well structure having a thickness which matches a light distribution width.

By applying the quasi type IIA or IIB multi-quantum well structure to the modulator 15 of the modulator integrated distributed feed-back laser shown in FIG. 1, an optical semiconductor device having characteristics not found in conventional devices can be provided.

It is also possible to fabricate an independent modulator unit separated from a laser by using the quasi type IIA or IIB multi-quantum well structure. Other semiconductor devices can be fabricated by using the quasi type IIA or IIB quantum well structure or multi-quantum well structure.

In the above embodiments, the quantum well structure described above is formed by mixed crystal of InGaAsP on an InP substrate. The quantum well structure may also be formed by other mixed crystals on an InP substrate, such as InAlAsP, InGaAlP, and InSbAsP. Of these materials, the material cited earlier is more preferable. Namely, the InGaAsP mixed crystal is most suitable, the InAlAsP mixed crystal is more suitable, and the InGaAlP mixed crystal is suitable. The substrate material may also be changed.

In the above description, the intermediate layer between the electron well layer and hole well layer forms a potential well of, or a potential barrier to, electrons and holes. The intermediate layer may form an auxiliary potential well for ones of electrons and holes, and an auxiliary potential barrier for the others. In this case, an overlap of the electron and hole wave functions depends on the degree of tunneling of carriers into the intermediate layer functioning as a barrier to the carriers.

The present invention has been described in connection with the preferred embodiments. The invention is not limited only to the above embodiments. It is apparent to those skilled in the art that various modifications, substitutions, improvements, combinations and the like can be made without departing from the scope of the appended claims.

I claim:

1. A semiconductor device having a quantum well structure, the quantum well structure comprising:

a first quantum well layer for forming a quantum well for electrons, said first quantum well layer having a first band structure;

a second quantum well layer for forming a quantum well for holes, said second quantum well layer having a second band structure different from the first band structure; and an intermediate layer interposed between said first and second quantum well layers having a third band structure different from the first and second band structures, wherein said first quantum well layer forms a potential barrier to holes, said second quantum well layer forms a potential barrier to electrons, and said third band structure forms a quantum well for electrons and holes.

2. A semiconductor device having a quantum well structure according to claim 1, wherein the first and second quantum layers and said intermediate layer are made of a material selected from the group consisting of InGaAsP, InAlAsP, InGaAlP, and InSbAsP.

3. A semiconductor device having a quantum well structure according to claim 1, further comprising:

a first potential barrier layer disposed on said first quantum well layer on the side opposite to said intermediate layer, and a second potential barrier layer disposed on said second quantum well layer on the side opposite to said intermediate layer.

4. A semiconductor device having a quantum well structure according to claim 1, wherein the third band structure forms a quantum well for electrons deeper than the first band structure and a quantum well for holes deeper than the second band structure.

5. A semiconductor device having a quantum well structure according to claim 1, further comprising:

a semiconductor substrate;

a lower side semiconductor layer formed on said semiconductor substrate, said lower side semiconductor layer being of a first conductivity type; and an upper side semiconductor layer formed on the quantum well structure, said upper side semiconductor layer being of a second conductivity type opposite to the first conductivity type, wherein the quantum well structure is formed on said lower side semiconductor.

6. A semiconductor device having a quantum well structure according to claim 5, further comprising a semiconductor laser structure formed on said semiconductor substrate in positional alignment with the quantum well structure, wherein the quantum well structure forms an optical modulator.

7. A semiconductor device having a quantum well structure according to claim 5, wherein the quantum well structure includes a repetitive disposal of said first and second quantum well layers and said intermediate layer.

* * * * *